United States Patent [19]

Kessler, Jr. et al.

[11] 3,978,518
[45] Aug. 31, 1976

[54] REINFORCED TRANSCALENT DEVICE

[75] Inventors: Sebastian William Kessler, Jr.; Robert Franklin Keller, both of Lancaster, Pa.

[73] Assignee: RCA Corporation, New York, N.Y.

[22] Filed: Nov. 12, 1975

[21] Appl. No.: 631,324

[52] U.S. Cl. .................................... 357/82; 357/74; 357/79; 357/81; 165/80; 165/105; 174/16 B; 174/16 HS
[51] Int. Cl.² ................. H01L 23/02; H01L 23/12; H01L 23/42; H01L 25/04
[58] Field of Search .................. 357/74, 81, 82, 79; 165/80, 105; 174/15, 16 B, 16 HS

[56] References Cited
UNITED STATES PATENTS

| | | | |
|---|---|---|---|
| 3,739,235 | 6/1973 | Kessler | 357/82 |
| 3,792,318 | 2/1974 | Fries et al. | 357/82 |
| 3,852,803 | 12/1974 | Walmet et al. | 357/82 |

OTHER PUBLICATIONS

Transcalent Silicon Power Rectifier; by Kessler; IEEE Transactions on Aerospace and Electronic Systems, vol. AES 7, No. 6, Nov. 1971.

Primary Examiner—Andrew J. James
Attorney, Agent, or Firm—Glenn H. Bruestle; George E. Haas

[57] ABSTRACT

A semiconductor wafer is sandwiched between the ends of two heat pipes. One end of each heat pipe is in electrical and thermal contact with the wafer. The heat pipes are fastened together so that the wafer is held in compression between the two heat pipes. The ends of the heat pipe, are reinforced from within the heat pipe so that the ends will not buckle due to the compression loading of the wafer.

8 Claims, 2 Drawing Figures

REINFORCED TRANSCALENT DEVICE

BACKGROUND OF THE INVENTION

The Government has rights in this invention pursuant to Contract No. DAAK02-72-C-0642 awarded by the Department of the Army.

The present invention relates to transcalent devices. A transcalent device is a semiconductor having at least one heat pipe connected to it. Many transcalent devices such as thyristors, transistors, gate turn off devices and power devices which operate at high currents have the semiconductors sandwiched between two heat pipes to aid in cooling the semiconductor. The two heat pipes are usually joined together with a structural member which protects the edge of the semiconductor and maintains the wafer under compression. It is imperative in these devices that the heat pipe be in good thermal contact with the semiconductor. It is also desirable to keep the wall of the heat pipe at the interface with the semiconductor very thin (about 0.4 millimeters) so as to provide good heat transfer between the semiconductor and the interior of the heat pipe.

Heretofore, attachment of the semiconductor device to the heat pipe was accomplished by soldering or clamping. If the thin end of the heat pipe was clamped against the semiconductor, the wall of the heat pipe would tend to buckle away from the semiconductor thereby reducing the thermal conductivity at the interface. This buckling may be reduced by increasing the thickness of the heat pipe wall. However, this would also increase the temperature gradient across the interface, thus increasing the thermal impedance between the junction of the semiconductor and the interior of the heat pipe. When soldering is employed to join the heat pipe and the semiconductor device, voids would often develop within the joining metal which adversely affected the heat transfer. Therefore, while the soldering prevented the heat pipe wall from buckling away from the semiconductor device, it did not provide for uniform heat transfer.

The aforementioned devices are to be distinguished from transcalent apparatus which use prepackaged or "hockey puck" semiconductor devices. In typical prepackaged semiconductor devices, the semiconductor wafer is held between two metal pole pieces which are connected by a cylindrical ceramic spacer. The prepackaged device resembles a hockey puck. The transcalent device is formed by placing heat pipes against the pole pieces. The prepackaged assemblies present several disadvantages. The hockey puck must be clamped between the heat pipes using insulated fasteners. The thermal impedance between the semiconductor wafer and each heat pipe is increased by the metal pole pieces.

SUMMARY OF THE INVENTION

A transcalent apparatus has a semiconductor device sandwiched between two heat pipes so that an end of each heat pipe is in electrical and thermal contact with the semiconductor device. The heat pipes are fastened together so as to compress the semiconductor between them. Each heat pipe contains reinforcements at the end which is adjacent the semiconductor device. The reinforcements prevent the end of the heat pipe from buckling without introducing additional thermal impedance between the semiconductor device and the heat pipes.

DETAILED DESCRIPTION OF THE INVENTION

Figure 1:
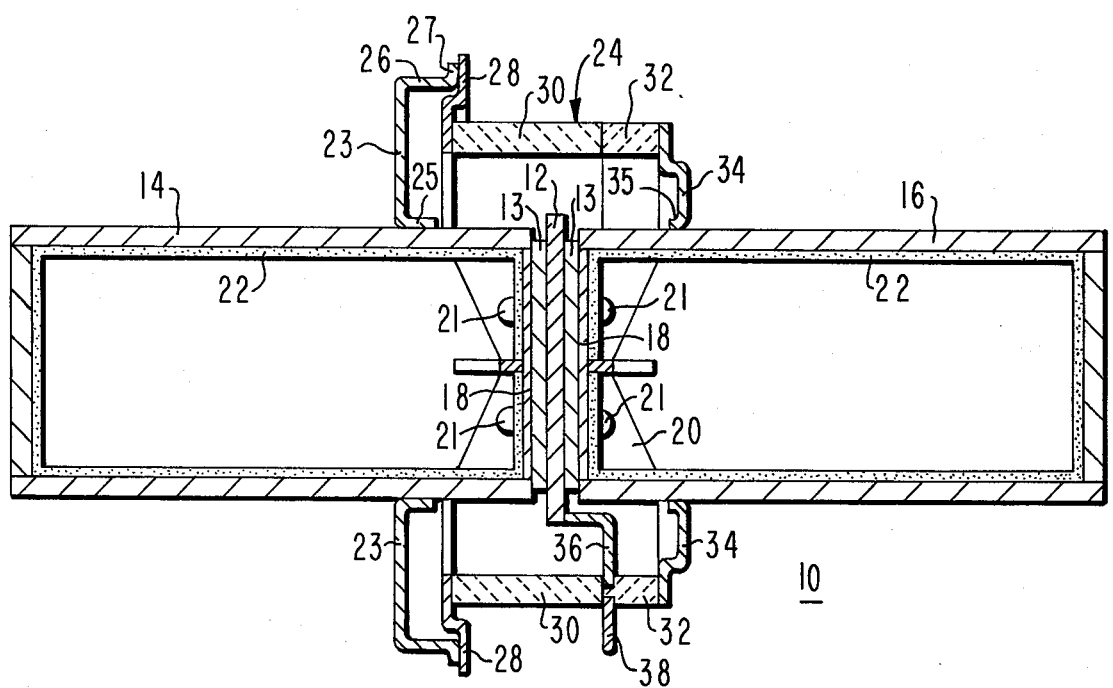
FIG. 1 is a longitudinal sectional view of a transcalent device according to the present invention.

A transcalent device 10 includes a semiconductor device in the form of a wafer 12 sandwiched between two heat pipes 14 and 16. The wafer 12 may be any of several well-known semiconductor devices such as a transistor. The wafer 12 has two major surfaces which form ohmic contacts for the emitter and the collector of the wafer 12.

Each of the heat pipes 14 and 16 have one end 18 which is in electrical and thermal contact with a different major surface of the wafer 12, so as to sandwich the wafer between two heat pipes. The ends 18 are very thin (0.4 mm for example) so that they are as thermally transparent as possible. A thin disc 13 (e.g. 0.127 mm thick) of an electrically and thermally conductive soft metal such as silver is between the wafer 12 and each heat pipe 14 and 16. The disc 13 insures good thermal and electrical contact between the wafer 12 and the heat pipes 14 and 16 by compensating for slight irregularities in the wafer and heat pipe surfaces. The heat pipes form separate electrical terminals for the transcalent device 10.

Several reinforcements, such as a plurality of struts 20, extend across the interior surface of each end 18 from the side walls of each heat pipe 14 and 16 to the center of each end wall 18. Brazing may be used to join the struts 20 to one another and to the heat pipes 14 or 16. The interior of the heat pipe as well as the surfaces of the struts 20 are coated with a conventional capillary wick liner 22. As is well known in the art and described in U.S. Pat. No. 3,739,235 issued on June 12, 1973 to Sebastian William Kessler Jr., the wick liners 22 may consist of porous copper layers in which an amount of working fluid, such as water, is used. Each strut 20 has an aperture 21 extending therethrough to aid the flow of the working fluid over the ends 18 of the heat pipes 14 and 16.

The wafer 12 is compressed between the two heat pipes 14 and 16 so that the ends 18 of heat pipes are in thermal and electrical contact with the major surfaces of the wafer. The amount of force compressing the wafer varies depending on application of the transcalent device but typically is about 2000 psi (14 megapascals). This compression is maintained by a tension loaded envelope 24 fastening the two heat pipes together. The envelope 24 encloses the semiconductor wafer providing a dry environment for the semiconductor. The envelope 24 includes a first metal ring 23 formed of cold rolled steel for example. The first ring 23 has an inner and an outer cylindrical flange, 25 and 26 respectively. Extending from the outer cylindrical flange 26 is a radial flange 27. The inner flange 25 extends around and is brazed to the exterior diameter of one of the heat pipes 14. A second metal ring 28 is welded to the radial flange 27 and is brazed to one end of a first tube 30 of electrical insulating material, such as an alumina ceramic. The other end of the first tube 30 is brazed to one end of a second tube 32, also of insulating material. The length of the ceramic tubes may vary in order to provide adequate high voltage insulation. The other end of the second tube 32 is brazed to a third ring 34. The third ring has a flange 35 which is brazed around the other heat pipe 16. The second and third rings 28 and 34 are composed of a metal, such as Kovar (Trademark), which has a coefficient of expansion which closely matches that of the ceramic tubes to which the rings are attached. The components of the envelope 24 form a cylindrical connector extending around and between the two heat pipes 14 and 16. The tubes 30 and 32 provide electrical insulation between the two heat pipes 14 and 16.

Figure 2:
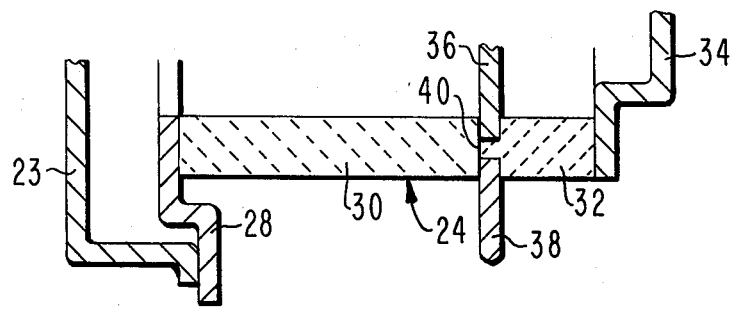
FIG. 2 is an enlargement of a portion of FIG. 1.

FIG. 2 shows a portion of the envelope 24 in more detail. An electrical base lead 36 extends from the base contact of the semiconductor wafer 12 to the interface of the first and second tubes 30 and 32. The base lead 36 extends into a shallow hole at the interface and is sandwiched between the two tubes. The lead 36 is electrically connected to the braze material 40 joining the two tubes. A lead pin 38 extends externally from another shallow hole at the interface between the first and second tubes 30 and 32 and is also electrically connected to the braze material 40. The base lead 36 and the lead pin 38 are not in physical contact. The combination of the base lead 36, the braze material 40 between the first and second tubes 30 and 32 and the pin connector 38 from the electrical conductor between the exterior of the transcalent device 10 and the base semiconductor wafer 12. The seal between the first and second tubes 30 and 32 is improved by using the braze material as a conductor rather than having a lead extending completely through the envelope.

The soldering of the semiconductor wafer 12 to the ends of the heat pipes 14 and 16 has been eliminated by compression loading the semiconductor wafer and reinforcing the walls of the heat pipes. When a transcalent device is fabricated, a manufacturing fixture is employed to compress the wafer between the two heat pipes 14 and 16. While the wafer is being compressed the components of the envelope 24 are joined together. The welding of the second ring 28 to the flange 27 is the final joining operation. When the fixture is released after the joining of the envelope 24, the envelope is in tension. This tension is evenly distributed around the exterior diameter of the heat pipes 14 and 16 by the respective first and third rings 26 and 34. This evenly distributed tension from the envelope 24 maintains the wafer 12 in compression eliminating the use of insulated bolts and clamps. The struts 20 within each heat pipe 15 and 16 reinforce the relatively thin end walls 18 insuring that they will not buckle away from the semiconductor wafer 12. It is the combination of the compression loading of the wafer by means of the envelope 24 and the reinforcement of the end walls 18 which eliminates the necessity to bond the surfaces of the wafer 12 to the heat pipes 14 and 16.

We claim:
1. A transcalent device comprising:
two closed heat pipes;
a semiconductor device sandwiched between the two heat pipes so that each heat pipe is in thermal and electrical contact with the semiconductor device;
fastening means for compressing the wafer between the two heat pipes; and
reinforcements within each heat pipe to prevent the ends, which are adjacent the semiconductor device, from buckling.

2. The device as in claim 1 including a disc of soft metal between the semiconductor device and each of the heat pipes.

3. The device as in claim 1 wherein the reinforcement within each heat pipe comprises a plurality of struts extending from the side wall of the heat pipe across the interior surface of the end which is in contact with the semiconductor device.

4. The device as in claim 3 wherein the struts are coated with the wick material of the heat pipe.

5. The device as in claim 1 wherein the fastening means comprises an insulating envelope extending around and joined to both of the heat pipes.

6. The device as in claim 5 wherein the envelope comprises a tube of insulating material extending around the heat pipes and a ring at each end of the tube, each ring attached to a different end of the tube and a different heat pipe.

7. The device as in claim 5 wherein the envelope comprises:
a first ring extending around and connected to one of the heat pipes;
a second ring attached to the first ring;
a first tube extending around the heat pipes and one end of the first tube connected to the second ring;
a second tube extending around the heat pipes, one end of the second tube attached to the other end of the first tube; and
a third ring extending around and connected to the other heat pipe and attached to the other end of the second tube.

8. The device as in claim 7 including;
a lead having one end attached to the base of the semiconductor device and the other end sandwiched between the first and second tubes;
a lead pin sandwiched between the first and second tubes and extending outward from the tubes; and
braze material bonding the two tubes together and providing electrical contact between the lead and the lead pin.

* * * * *